(12) United States Patent
Takemura et al.

(10) Patent No.: US 6,523,153 B1
(45) Date of Patent: Feb. 18, 2003

(54) METHOD OF DESIGN VERIFICATION FOR INTEGRATED CIRCUIT SYSTEM AND METHOD FOR GENERATING INTERFACE MODEL FOR DESIGN VERIFICATION

(75) Inventors: Kazuyoshi Takemura, Kyoto (JP); Masanobu Mizuno, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 132 days.

(21) Appl. No.: 09/671,020

(22) Filed: Sep. 28, 2000

(30) Foreign Application Priority Data

Sep. 29, 1999 (JP) ............................................ 11-276447

(51) Int. Cl.$^7$ ................................................. G06F 9/45
(52) U.S. Cl. ...................... 716/5; 716/5; 716/1; 716/11
(58) Field of Search ................................ 716/5, 6, 7, 4, 716/3, 17, 1, 11, 18; 703/14; 395/500

(56) References Cited

U.S. PATENT DOCUMENTS

| 5,493,507 A | | 2/1996 | Shinde et al. | |
| 5,544,067 A | | 8/1996 | Rostoker et al. | |
| 5,870,308 A | | 2/1999 | Dangelo et al. | |
| 5,907,698 A | * | 5/1999 | Kucukcakar et al. | 716/11 |
| 5,956,497 A | * | 9/1999 | Ratzel et al. | 716/1 |
| 5,995,736 A | * | 11/1999 | Aleksic et al. | 716/8 |
| 6,044,211 A | * | 3/2000 | Jain | 716/18 |
| 6,066,178 A | * | 5/2000 | Bair et al. | 708/625 |
| 6,199,031 B1 | * | 3/2001 | Challier et al. | 703/14 |
| 6,334,207 B1 | * | 12/2001 | Joly et al. | 716/1 |

* cited by examiner

Primary Examiner—Vuthe Siek
Assistant Examiner—Binh Tat
(74) Attorney, Agent, or Firm—McDermott, Will & Emery

(57) ABSTRACT

In a design process of an integrated circuit system, an interface model is generated between a behavioral model described at a behavioral level and an RTL model connected to the behavioral model. The interface model includes protocol converter, bit precision converter and signal converter. The protocol converter converts the protocol of the behavioral model, from which the concept of "clock" is absent, into that of the RTL model to time the behavior represented by the behavioral model with clock pulses for the RTL model. The bit precision converter converts the decimal point representations or bit widths of input/output data. And the signal converter converts signal lines or signal values for an input/output signal of the behavioral model. By providing an interface model like this, the overall system can have its design verified.

13 Claims, 8 Drawing Sheets

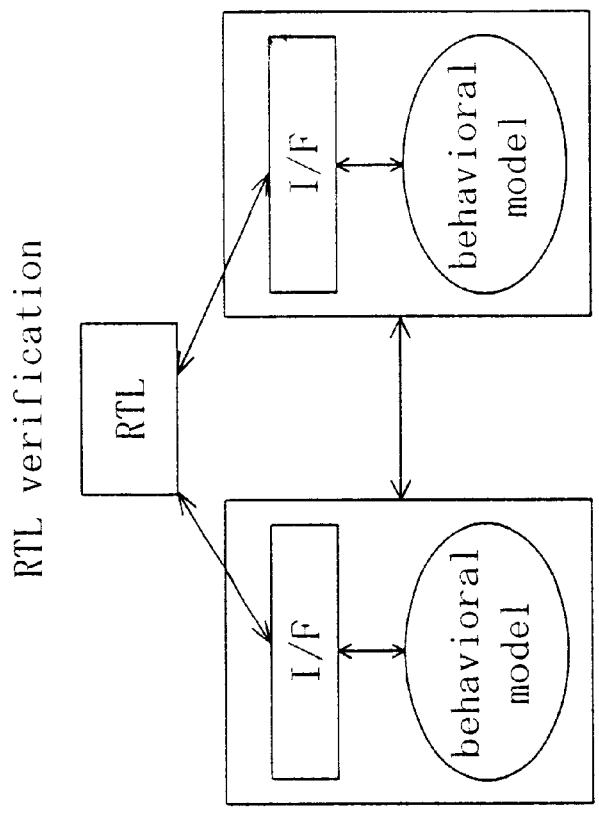
Fig. 1(b) RTL verification
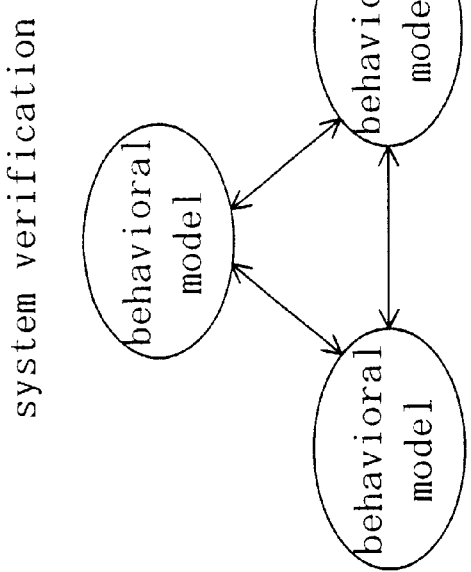
Fig. 1(a) system verification

|  | bit width | clock | delay |
|---|---|---|---|
| behavioral model (floating-point) | × | × | × |
| behavioral model (fixed-point) | ○ | × | × |
| RTL model | ○ | ○ | × |

METHOD OF DESIGN VERIFICATION FOR INTEGRATED CIRCUIT SYSTEM AND METHOD FOR GENERATING INTERFACE MODEL FOR DESIGN VERIFICATION

BACKGROUND OF THE INVENTION

The present invention relates generally to a design process of an integrated circuit system, and particularly relates to design technology developed to cope with system-on-chip implementations. More specifically, the present invention pertains to design verification techniques applicable to high level stages of a design process.

An integrated circuit system for an electronic unit has been fabricated until just recently by forming individual types of LSIs such as memories and processors on respective semiconductor chips and then mounting and interconnecting all of these chips together on a motherboard like a printed wiring board.

Over the past few years, however, an integrated circuit system is increasingly required to have its overall size, weight, power dissipation and fabrication cost reduced to further broaden the industrial applicability of an electronic unit including the system. Among other things, a consumer electronic appliance for use in digital information processing has to meet all of these requirements more perfectly than any other electronic unit. Responsive to such a demand from the electronics industry, the prime target of research and development by semiconductor makers is now shifting from memories to system LSIS.

Specifically, a system LSI is a single-chip implementation including memories and various types of logic circuits that are integrated together on a single chip. To realize a "system-on-chip" like this, not only the process technology of forming devices with dissimilar structures on a common substrate, but also the design technology thereof should be greatly innovated.

Thus, according to a suggested technique of designing a system-on-chip, a database is prepared in advance to design so-called "functional blocks" implementing required functions. By using such a database, any desired system LSI can be designed as a combination of these blocks. In such a case, a specific physical structure for executing an intended function has been defined in advance for each functional block. Thus, in the physical design of an overall integrated circuit system, only the interconnections among these functional blocks and peripheral circuits have to be newly defined. In this manner, the conventional method tries to increase the design efficiency considerably.

The conventional design method, however, has the following drawbacks.

At a high level stage of a design process, i.e., at a behavioral level (or algorithm level) stage, a functional block for a system is described as a behavioral model. And at this early stage, the overall design of the system is verified. Next, at a lower level stage of the design process, i.e., at a register transfer level (RTL) stage, the behavioral model for the functional block is mapped to an RTL model, or a physically working model of the functional block. And the RTL model description is verified at this stage. However, if the remaining part of the system still consists of behavioral models, then the overall system is not verifiable yet. That is to say, when behavioral and RTL models, which are associated with mutually different levels of abstraction, coexist in the design data, it is difficult to verify the design of the overall system in a cooperative manner.

SUMMARY OF THE INVENTION

It is therefore an object of the present invention to make an overall integrated circuit system being designed verifiable efficiently even if its design data includes models associated with mutually different levels of abstraction.

Specifically, an inventive method of design verification for an integrated circuit system includes the step of making up design data, including RTL and behavioral models in combination, for the system being designed. Each RTL model is described at a register transfer level, while each behavioral model is described at a behavioral level that is an abstraction level higher than the RTL level. The method further includes the steps of: generating an interface model between one of the behavioral models and one of the RTL models that is connected to the behavioral model for the design data; and verifying the design of the system using the design data including the interface model.

In one embodiment of the present invention, the interface model preferably includes a protocol converter for converting a protocol for the behavioral model into a protocol for the RTL model, and vice versa.

In this particular embodiment, the interface model may include a bit precision converter for converting bit precision by means of decimal point representations or bit widths in such a manner that input/output data of the behavioral model matches to input/output data of the RTL model.

Alternatively, the interface model may include a signal converter for matching an input/output signal of the behavioral model to an input/output signal of the RTL model.

As another alternative, the protocol converter may include storage means for storing input/output data of the behavioral model thereon and control means for controlling the storage means.

An inventive method for generating an interface model is applicable to verification of an integrated circuit system that is being designed using design data where RTL and behavioral models coexist. Each RTL model is described at an RTL level, while each behavioral model is described at a behavioral level that is an abstraction level higher than the RTL level. The interface model is generated between one of the behavioral models and one of the RTL models that is connected to the behavioral model.

In one embodiment of the present invention, the interface model preferably includes a protocol converter for converting a protocol for the behavioral model into a protocol for the RTL model, and vice versa.

In this particular embodiment, the interface model may include a bit precision converter for converting bit precision by means of decimal point representations or bit widths in such a manner that input/output data of the behavioral model matches to input/output data of the RTL model.

Alternatively, the interface model may include a signal converter for matching an input/output signal of the behavioral model to an input/output signal of the RTL model.

As another alternative, the protocol converter may include storage means for storing input/output data of the behavioral model thereon and control means for controlling the storage means.

BRIEF DESCRIPTION OF THE DRAWINGS

FIG. 1 illustrates a basic technical concept of the present invention.

DESCRIPTION OF THE PREFERRED EMBODIMENTS

Hereinafter, preferred embodiments of the present invention will be described with reference to the accompanying drawings.

FIG. 1 illustrates a basic technical concept of the present invention. As shown in FIG. 1-(a), respective functional blocks are represented as simple behavioral models at an early, high level (i.e., a behavioral or algorithm level) stage of the design process of an integrated circuit system. That is to say, these behavioral models define specifically how the associated functional blocks should behave. And at this stage, the behavior of the overall system being designed is verified.

Next, at an RTL verification stage, one of the behavioral models, which represents the behavior of an associated functional block, is designed at a register transfer level, which is an abstraction level lower than the behavioral level. As a result, the behavioral model is mapped to an RTL model as shown in FIG. 1-(b). In this case, however, the remaining part of the system still consists of behavioral models, and therefore, the overall system, including the RTL model, is not yet verifiable at this time.

Thus, according to the present invention, interface models (I/F) are generated between the behavioral models and the RTL model connected to the behavioral models to verify the design of the overall system at this stage, i.e., to make the behavioral models operable cooperatively with the RTL model. In this manner, the present invention provides an environment where even a system, including RTL and behavioral models associated with mutually different levels of abstraction, is verifiable.

Figures 2A, 2B:
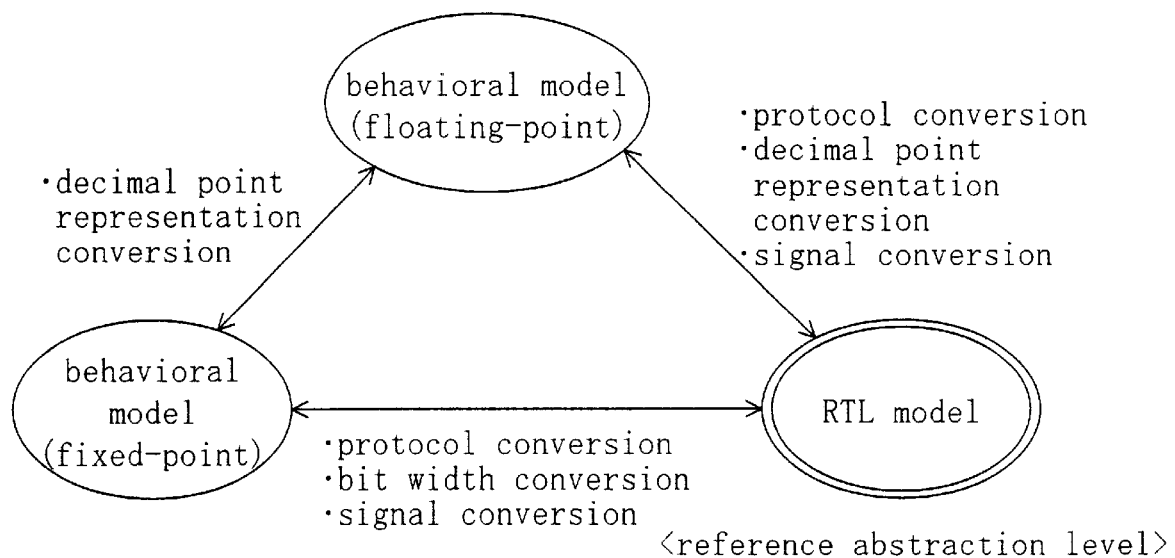
FIGS. 2(a) and 2(b) illustrate three models associated with mutually different levels of abstraction.

FIGS. 2(a) and 2(b) illustrate three models associated with mutually different levels of abstraction for use in the design of a system. According to the present invention, the three models shown in FIGS. 2(a) and 2(b), namely, behavioral model using floating-point representation, behavioral model using fixed-point representation and RTL model, are supposed to be used.

Firstly, as can be seen from FIG. 2(a), the behavioral models are completely different from the RTL model in that the concept of "clock" is totally absent from the behavioral models. In other words, the behavioral models have no concept of "time" or "delay". Accordingly, to verify the design of a system with the behavioral and RTL models matched to each other, the concept of "delay" should be introduced into the behavioral model. For that reason, in matching the abstraction level of the behavioral models to that of the RTL model, i.e., the reference abstraction level, the protocol conversion should be performed as shown in FIG. 2(b) to time the behavior represented by the behavioral models with clock pulses for the RTL model.

Also, the concept of "bit width" is absent from the behavioral level using the floating-point representation unlike the behavioral level using the fixed-point representation. Accordingly, to match the abstraction level of the behavioral model using the floating-point representation to that of the RTL model or that of the behavioral model using the fixed-point representation, the decimal point representations of input/output data should be converted. Furthermore, in matching the abstraction level of the behavioral model using the fixed-point representation to that of the RTL model, there is no need to convert the decimal point representations but the bit widths of the input/output data should be converted. In the following description, the conversion of decimal point representations and that of bit widths will be collectively referred to as "bit precision conversion".

In addition, to interconnect the behavioral models to the RTL model through signal lines, the signal lines and values of input/output signals of the behavioral models should also be converted.

Taking these points into account, the interface model according to the present invention performs not only the protocol conversion but also the bit precision conversion and signal conversion when required.

Figure 3:
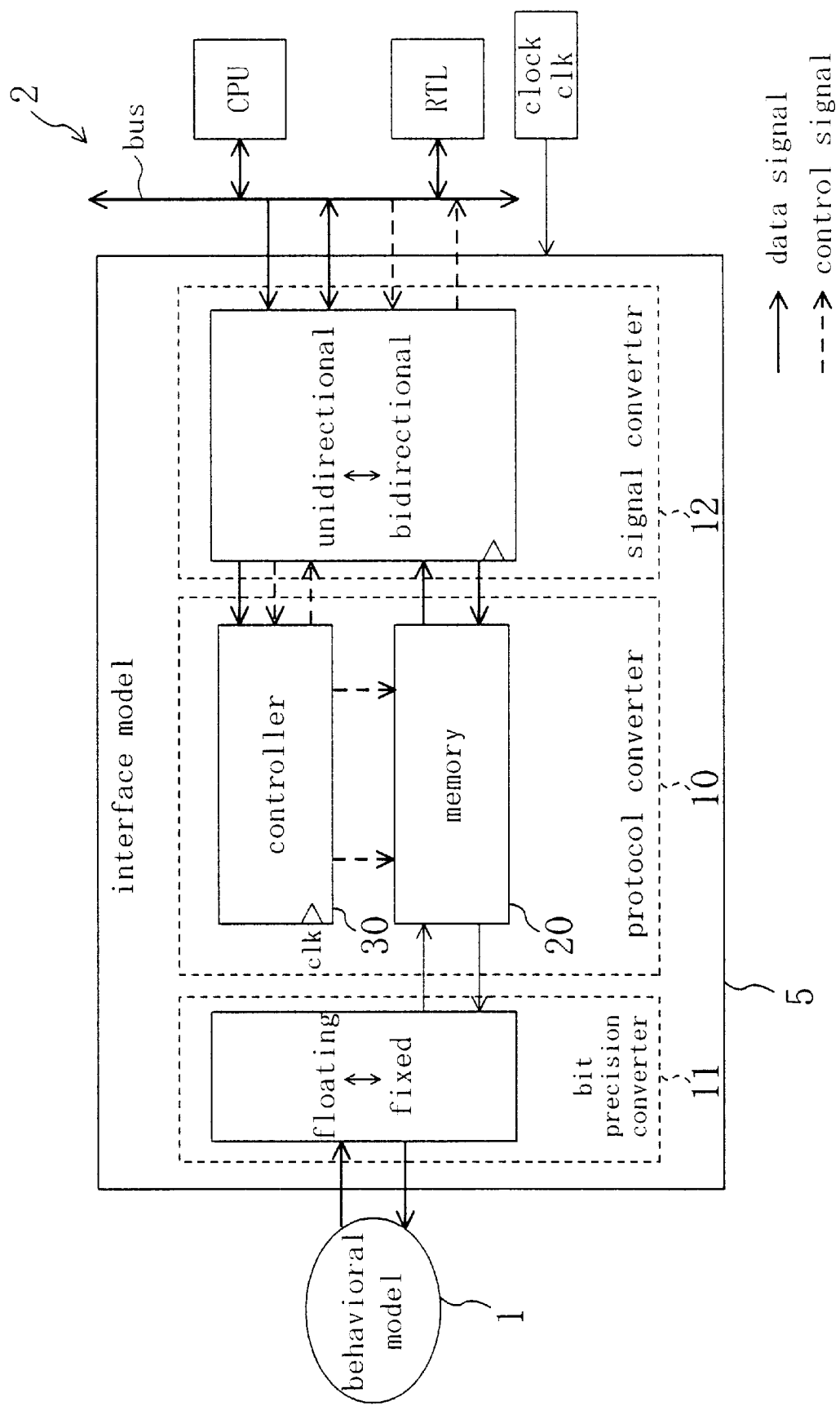
FIG. 3 is a block diagram illustrating a fundamental configuration for an interface model according to an embodiment of the present invention.

FIG. 3 is a block diagram illustrating a fundamental configuration for an interface model according to an embodiment of the present invention. As shown in FIG. 3, an interface model 5 has been generated between a behavioral model 1 and an RTL model 2. The interface model 5 includes protocol converter 10, bit precision converter 11 and signal converter 12. The protocol converter 10 converts the protocol of the behavioral model 1 into that of the RTL model 2 to time the behavior represented by the behavioral model 1, from which the concept of "clock" is totally absent, with clock pulses clk for the RTL model 2. Specifically, the protocol converter 10 includes a random access memory (RAM) 20 for storing (or buffering) the input/output data of the behavioral model 1 thereon and a controller 30 for controlling the memory 20. The memory 20 and controller 30 are exemplary storage means and control means as defined in the appended claims. The memory 20 buffers the data to match the protocols to each other, while the controller 30 gets the data, which has been stored on the memory 20, input or output at an appropriate time responsive to an external control signal.

Protocol Conversion

Figure 4:
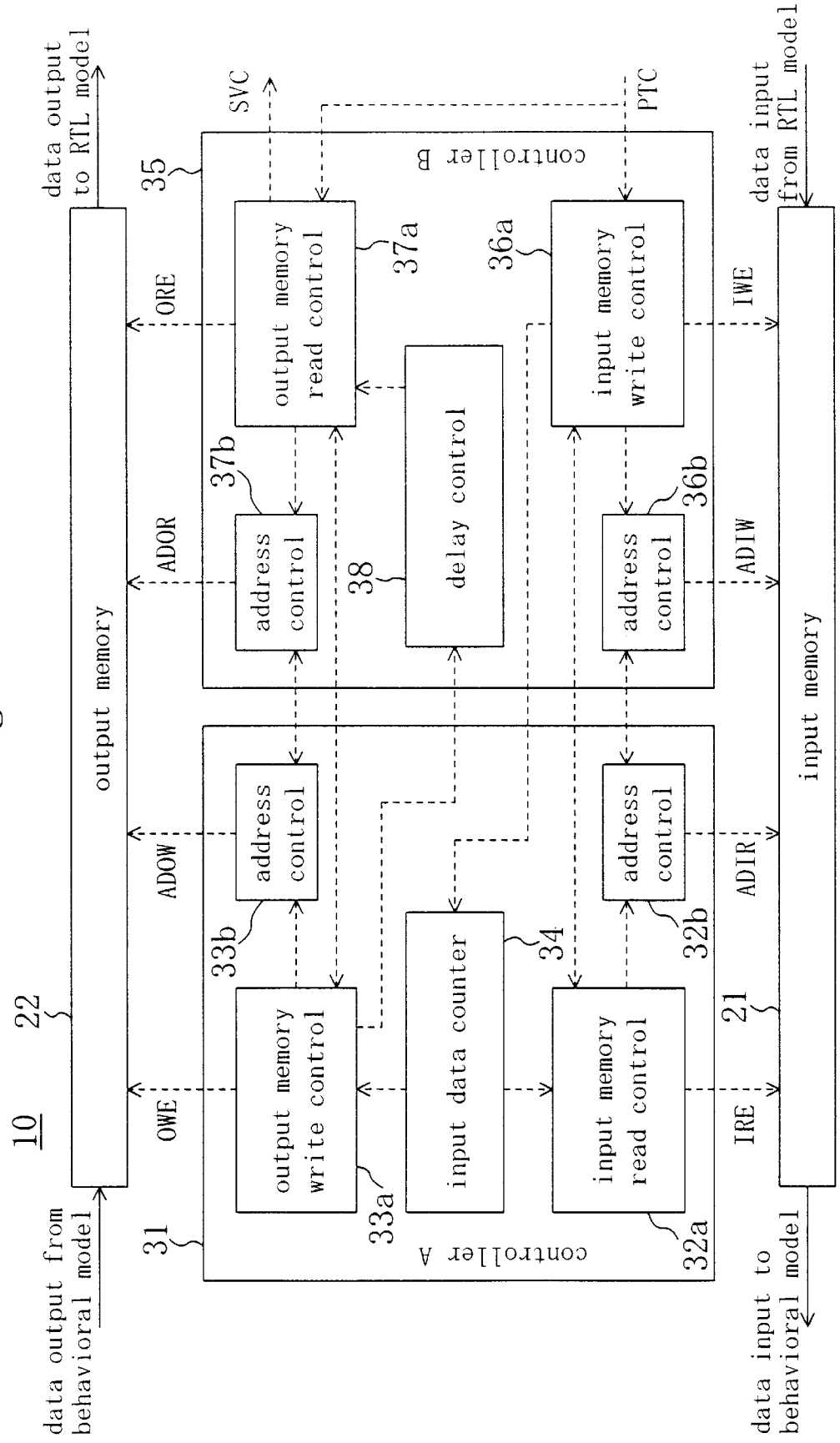
FIG. 4 is a block diagram illustrating a specific configuration for the protocol converter shown in FIG. 3.

FIG. 4 is a block diagram illustrating a specific configuration for the protocol converter 10. The components shown in FIG. 4 have been so arranged as to make a behavioral model 1 that operates in compliance with the JPEG standard, for example. In FIG. 4, the RAM 20 shown in FIG. 3 is divided into an input memory 21 for storing (or buffering) data to be input to the behavioral model 1 and an output memory 22 for storing (or buffering) data that has been output 25 from the behavioral model 1. In addition, the controller 30 shown in FIG. 3 is also divided into a controller A 31 that performs controls for the behavioral model 1 and a controller B 35 that performs controls for the RTL model 2.

Hereinafter, it will be described how the respective components of the protocol converter 10 shown in FIG. 4 operate. First, in the controller B 35, an input memory write control unit 36a receives a signal PTC, representing the protocol of the RTL model 2, and outputs a write signal IWE to the input memory 21 according to the protocol. In accordance with an instruction from the input memory write control unit 36a, an address control unit 36b outputs a write address ADIW for the input data, received from the RTL model 2, to the input memory 21. As a result, the input data received from the RTL model 2 is stored on the input memory 21.

In the controller A 31, an input data counter 34 receives the output signal of the input memory write control unit 36a of the controller B 35, thereby counting the number of data words that have been input to the input memory 21. When the count reaches the number of data words that the behavioral model 1 can handle at a time, the counter 34 informs an input memory read control unit 32a that the input data words to be processed by the behavioral model 1 at a time have been stored on the input memory 21. In accordance with this information, the input memory read control unit 32a outputs a read signal IRE to the input memory 21. Also, on receiving an instruction from the input memory read control unit 32a, an address control unit 32b outputs a read address ADIR, at which the input data received from the RTL model 2 should be read out, to the input memory 21. As a result, the input data, which will be processed by the behavioral model 1 at a time, is output from the input memory 21.

As described above, the concept of "time" is absent from the behavioral model 1. Accordingly, as soon as the data in that quantity is input to the behavioral model 1, the data is processed and data representing the result of this processing is output.

In the controller A 31, an output memory write control unit 33a outputs a write signal OWE instructing that the output data of the behavioral model 1 should be written on the is output memory 22. On receiving an instruction from the output memory write control unit 33a, an address control unit 33b outputs a write address ADOW, at which the output data of the behavioral model 1 should be written, to the output memory 22. As a result, the output data of the behavioral model 1 is stored on the output memory 22.

In. the controller B 35, a delay control unit 38 receives the output signal of the output memory write control unit 33a of the controller A 31. In response, the control unit 38 informs an output memory read control unit 37a of a predetermined number of clock cycles for which the output of the data from the output memory 22 should be delayed. The output memory read control unit 37a receives the signal PTC representing the protocol of the RTL model 2. According to this protocol, the control unit 37a delays the output of a read signal ORE to the output memory 22 until the predetermined number of clock cycles, specified by the delay control unit 38, have passed. On receiving an instruction from the output memory read control unit 37a, an address control unit 37b outputs a read address ADOR, at which the output data of the behavioral model 1 should be read out, to the output memory 22. As a result, the data words, representing the results of processing performed by the behavioral model 1, are sequentially output from the output memory 22 to the RTL model 2.

Also, the output memory read control unit 37a outputs a signal SVC, indicating whether or not the data has been output from the output memory 22, to the signal converter 12. This signal SVC will be used for signal value conversion to be described later.

Figure 5:
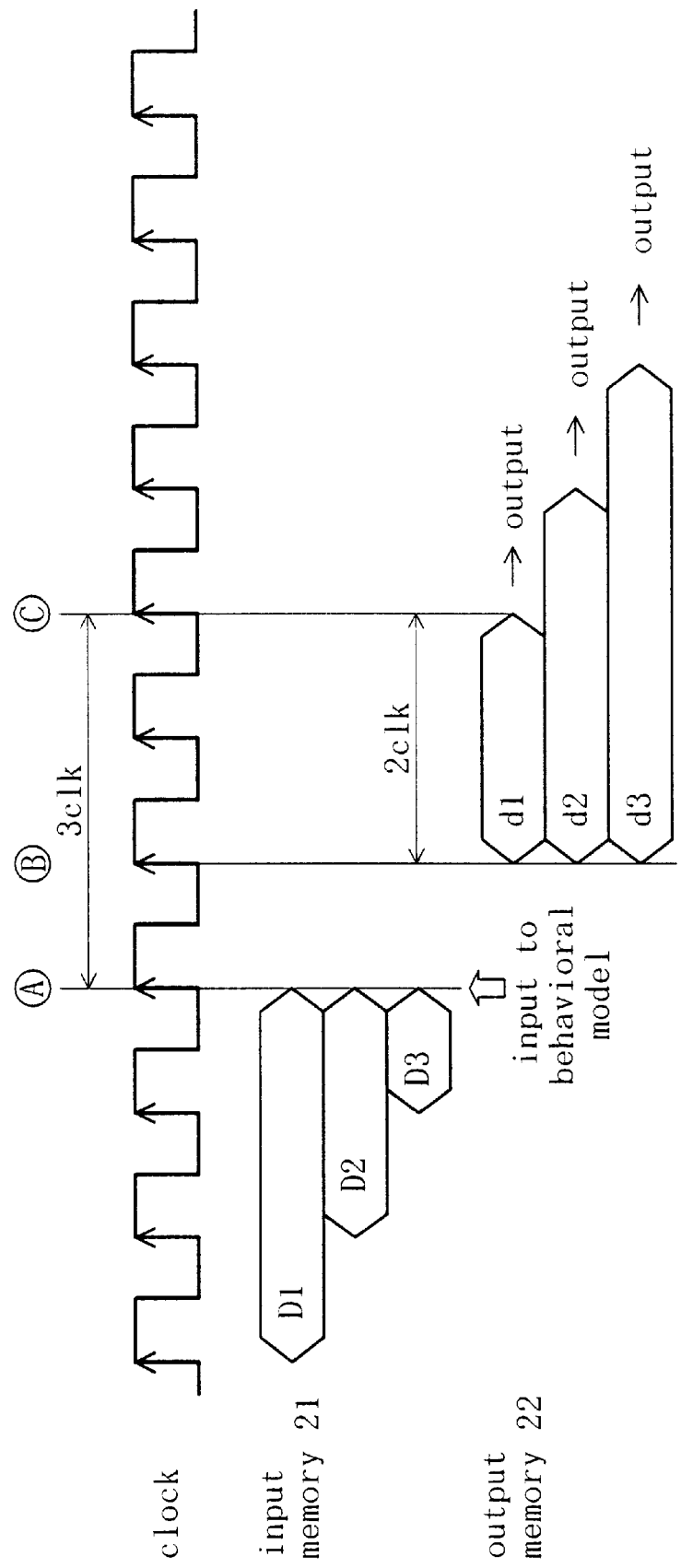
FIG. 5 is a timing diagram illustrating how data stored on the input and output memories shown in FIG. 4 changes with time.

FIG. 5 is a timing diagram illustrating how the data stored on the input and output memories 21 and 22 shown in FIG. 4 changes with time. In the example illustrated in FIG. 5, the number of data words that the behavioral model 1 can handle at a time is three. First, input data words D1, D2 and D3, which have been received from the RTL model 2, are stored,one after another on the input memory 21 synchronously with every leading edge of the clock signal. At a point in time A when these three data words D1, D2 and D3, the number of which is equal to the number of data words to be processed by the behavioral model 1 at a time, are stored on the input memory 21, these data words D1, D2 and D3 are input to the behavioral model 1. And as soon as these data words D1, D2 and D3 are processed by the behavioral model 1, data words d1, d2 and d3 are output. Then these data words d1, d2 and d3 are stored on the output memory 22 at the next leading edge (i.e., a time B) of the clock signal.

In this case, there is no time lag between the time A when the data words D1, D2 and D3 are input from the RTL model 2 to the behavioral model 1 and the time when the data words d1, d2 and d3, representing the results of processing performed by the behavioral model 1, are output from the behavioral model 1. However, when this behavioral model 1 is mapped to an RTL model at a later stage of the design process, the output of those data words, representing the results of processing, shall be delayed by an appropriate amount of time determined by the specification and protocol of the behavioral model 1. Accordingly, to match the behavioral model 1 to the RTL model 2, the delay should be adjusted.

In the example illustrated in FIG. 5, the output of the first data word d1, representing the result of processing, is delayed for three clock cycles. But the delay control unit 38 shown in FIG. 4 tells the output memory read control unit 37a that the predetermined number of clock cycles, for which the output of the data is delayed, should be "two", not "three", to adjust the delay. This is because each output data word of the behavioral model 1 is stored on the output memory 22 at the time B, which is already delayed by one clock cycle from the time when the data word was output from the behavioral model 1. Accordingly, the data words d1, d2 and d3, representing the processing results, start being output one after another at a time C, which is three clock cycles after the three input data words D1, D2 and D3 of the RTL model 2 were stored on the input memory 21.

In the arrangement shown in FIG. 4, the memory 20 is divided into the input and output memories 21 and 22. This is because the protocol conversion should be performed differently for the input and output sections and because the controller can be designed more easily and can have its configuration simplified with such a divided arrangement. In addition, the memory should preferably have input and output sections that are controllable independently, because input and output data words are often processed in parallel by a behavioral model. However, as for a behavioral model handling only the input or output data (e.g., a behavioral model outputting a random signal or a signal with a fixed level ("1", for example)), there is no need to divide the memory. Furthermore, even for a behavioral model handling both of the input and output data, if the input and output data are completely discrete on the time axis, the memory need not be divided, either.

Furthermore, a RAM is used as the storage means in the arrangement shown in FIG. 4. Alternatively, if the protocol conversion needed is not so complicated, a first-in, first-out (FIFO) memory may be used instead. When a RAM is used, the RAM can be accessed (i.e., written or read) in a complex manner but rather complicated control will be needed because address signals should be generated. On the other hand, if an FIFO memory is used, then no address signals will be necessary and the control can be carried out only with write and read signals. Thus, the address control units 32b, 33b, 36b and 37b can be eliminated in that case.

Moreover, the controller 30 is divided into two sections 31 and 35 performing controls for the behavioral and RTL models, respectively, in the arrangement shown in FIG. 4. In this arrangement, these controllers 31 and 35 are operable highly independently, thus greatly increasing the design efficiency and re-applicability of those controllers 31 and 35. That is to say, if the same behavioral model should be connected to a different RTL model, then only the controller B 35, carrying out controls for the RTL model, should be changed or modified. And when the same protocol may be complied with, just the behavioral model and the controller A 31, carrying out controls for the behavioral model, need to be changed.

The controller, performing controls for the RTL model, may be designed in the following manner. The contents of a protocol are variable depending on the bus protocol or signal exchange method of the RTL model. Thus, the controller should be designed by applying a finite state machine (FSM), for example, thereto so as to generate control output signals to respective blocks to be controlled responsive to externally input data, address and control input signals.

On the other hand, the controller, performing controls for the behavioral model, may be designed in the following manner. Suppose a given behavioral model is a model for use in simple data processing, e.g., a model that has been designed to perform only compression according to the JPEG. In that case, the controller should be designed such that as soon as a data word composed of 8×8 pixels, which is a minimum unit of processing, is stored on the input memory, that pixel data is supplied to the behavioral model at a time.

On the other hand, suppose a given behavioral model should have its type of operation changed with the setting of a function register. For example, the given model may be able to selectively perform compression or expansion depending on the value of the function register in accordance with the JPEG. Generally speaking, such a function register is normally not included in the behavioral model itself. Accordingly, in that case, operation setting storage, which can execute a function equivalent to that of the function register, should be separately provided inside a memory that can be accessed by the controller performing controls for the behavioral model. Also, the controller, performing controls for the behavioral model, should have means for converting an address at the function register into an address at the operation setting storage such that if a value of the function register has been set by the RTL model, the value will be stored on the operation setting storage included in the memory.

And based on the value stored on the operation setting storage, the controller, performing controls for the behavioral model, outputs an appropriate control signal to the behavioral model. As a result, if the behavioral model should comply with the JPEG, for example, then either compression or expansion will be performed selectively. Naturally, such setting is not needed if the behavioral model already includes the function register.

Bit Precision Conversion

Figure 6:
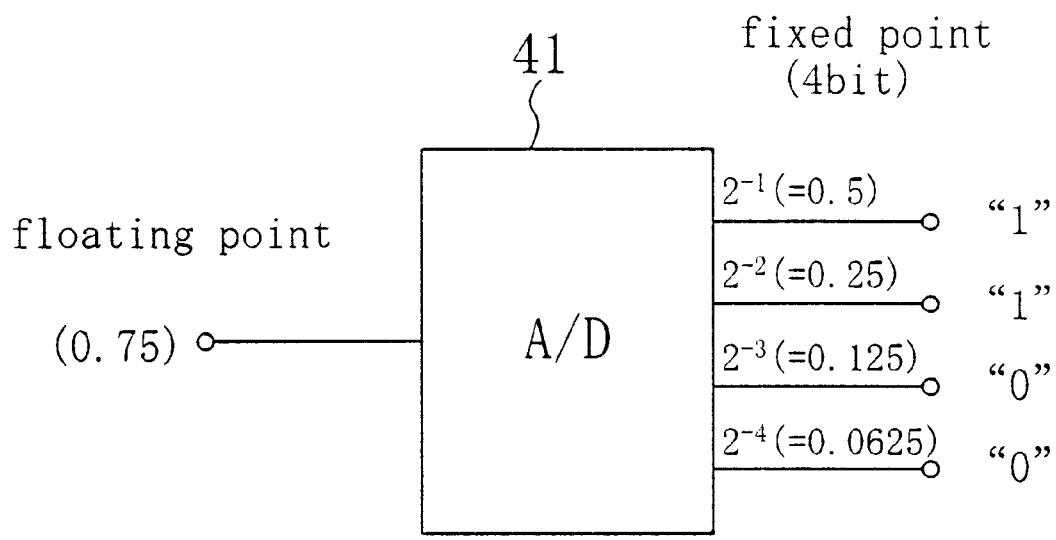
FIG. 6 illustrates an exemplary implementation to carry out bit precision conversion.

The bit precision converter 11 shown in FIG. 3 converts the decimal point representations or bit widths of input/output data. Specifically, the bit precision converter 11 is implementable as the A/D converter 41 shown in FIG. 6, for example, which has a bit precision of four bits. The A/D converter 41 converts floating-point data (e.g., 0.75) into fixed-point 4-bit data (e.g., 1100), and specifies, using parameters, how much rounding error is allowable. When the bit widths should be converted (e.g., converting N-bit data into M-bit data), the bit precision converter may be a serial connection of an N-bit D/A converter and an M-bit A/D converter.

Signal Conversion

The signal converter 12 shown in FIG. 3 changes signal lines or signal values for an input/output signal.

Figure 7A:
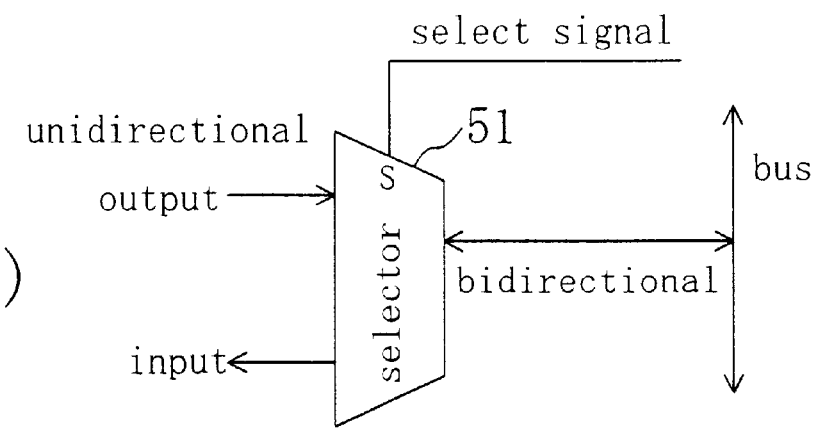
FIGS. 7(a), 7(b) and 7(c) illustrate exemplary implementations to carry out signal line switching.
Figure 7B:
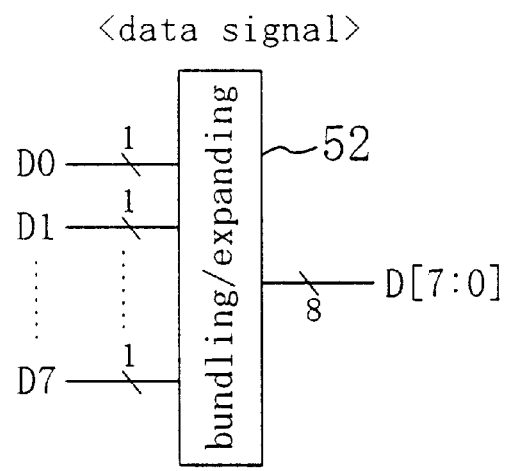
Figure 7C:
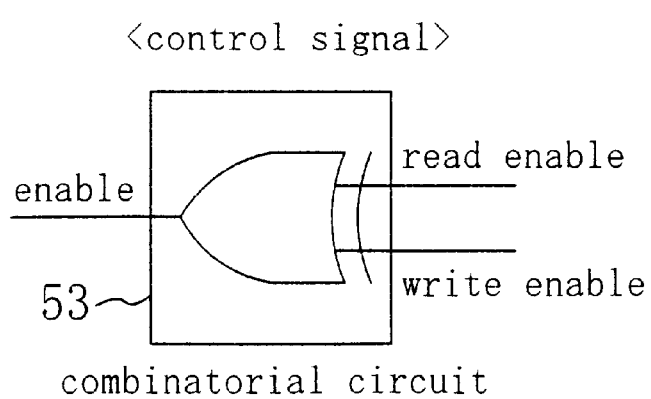
Figure 8:
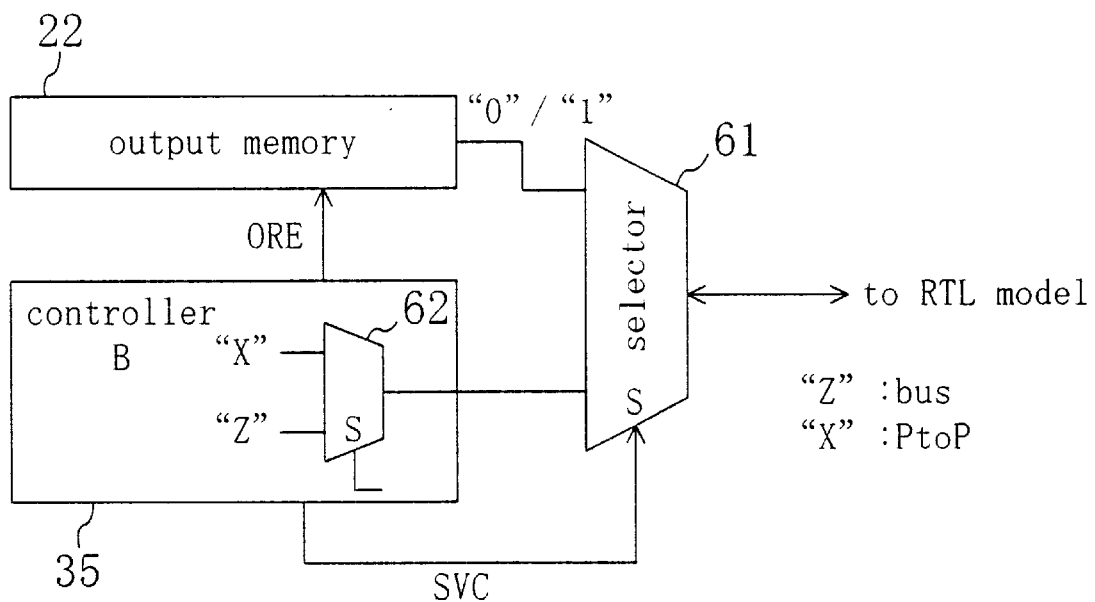
FIG. 8 illustrates an exemplary implementation to carry out signal value conversion.

Specifically, signal lines may be changed by any of the circuits shown in FIGS. 7(a), 7(b) and 7(c), for example. First, the direction of a signal line may be changed from unidirectional into bidirectional, or vice versa, using the selector 51 shown in FIG. 7(a). In this case, a read enable signal for a bus can be used as a select signal for the selector 51. While the read enable signal provided as the select signal is asserted, the selector 51 activates the output signal line. On the other hand, while the read enable signal is negated, the selector 51 activates the input signal line. It is naturally possible to input a write enable signal for a bus instead of the read enable signal or to provide the read and write enable signals in combination.

The number of signal lines may be changed (e.g., from a single signal into multiple signals, or vice versa) by any of the circuits shown in FIGS. 7(b) and 7(c). First, as for a data signal, the circuit 52 with bundling/expanding functions shown in FIG. 7(b) may be used. As for a control signal on the other hand, the combinatorial circuit 53 shown in FIG. 7(c) may be used. Naturally, the type of the best combinatorial circuit to be used changes with how to convert the signal lines.

Also, signal values sometimes need to be converted. Specifically, although a data word may assume either "0" or "1" in a behavioral model, values the data word possibly assumes in an RTL model include not only "0" and "1" but also an indefinite value "X" and a high impedance value "Z". Accordingly, while a behavioral model is not outputting any data word to an RTL model, "X" or "Z" should be selectively output according to the destination or the protocol. A signal value conversion like this can be carried out using an arrangement such as that shown in FIG. 5. The controller B 35 selectively outputs "X" or "Z" to a selector 61. The selector 61 receives the output signal of the controller B 35 as a select signal SVC. While the output memory 22 is outputting a data word to the selector 61, the selector 61 outputs the data word received to an RTL model. On the other hand, while the output emory 22 is outputting no data words to the selector 61, the selector 61 outputs "X" or "Z", which has been received from the controller B 35, to the RTL model. The controller B 35 is preset in such a manner as to selectively output "X" or "Z" depending on the destination. For example, if the destination is a bus, the controller B 35 outputs the high impedance value "Z". On the other hand, if point-to-point communication is needed, then the controller B 35 outputs the indefinite value "X".

As described above, even if RTL and behavioral models with mutually different abstraction levels coexist in design data for an integrated circuit system, an interface model is generated according to the present invention between one of the behavioral models and one of RTL models that is connected to the behavioral model. Thus, the design of the overall system is verifiable efficiently and at a high speed.

What is claimed is:

1. A method of design verification for an integrated circuit using a design data including a RTL model described at a register transfer level, and a behavioral model described at a behavioral level that is an abstraction level higher than the RTL level, the method comprising the steps of:

generating an interface model between one of the behavioral models and one of the RTL models that is connected to the behavioral model for the design data; and verifying the design of the integrated circuit using the design data and the interface model, wherein said interface model matches an output data of the behavioral model to an input data of the RTL model, and matches an output signal of the behavioral model to a input signal of the RTL model.

2. The method of claim 1, wherein the interface model comprises a protocol converter for converting a protocol for the behavioral model into a protocol for the RTL model, and vice versa.

3. The method of claim 2, wherein the interface model comprises a bit precision converter for converting bit precision by means of decimal point representations or bit widths in such a manner that input/output data of the behavioral model matches to input/output data of the RTL model.

4. The method of claim 2, wherein:

the interface model comprises a signal converter for matching an input/output signal of the behavioral model to an input/output signal of the RTL model, and the signal converter changes directions or the number of input/output signal lines of the behavioral model.

5. The method of claim 2, wherein:

the interface model comprises a signal converter for matching an input/output signal of the behavioral model to an input/output signal of the RTL model, and the signal converter changes a value of the input/output signal of the behavioral model.

6. The method of claim 2, wherein the protocol converter comprises:

storage means for storing input/output data of the behavioral model thereon; and control means for controlling the storage means.

7. The method of claim 6, wherein the storage means is made up of two separate sections for storing thereon the input data and the output data of the behavioral model, respectively.

8. The method of claim 6, wherein the control means is made up of two separate sections for performing controls for the behavioral and RTL models, respectively.

9. The method of claim 6, wherein the control means adjusts a delay, which is caused by getting the output data of the behavioral model stored on the storage means, such that the delay of the output data of the behavioral model complies with both of the protocols of the behavioral and RTL models.

10. The method of claim 6, wherein the storage means comprises operation setting storage for storing values specifying a type of operation to be implemented by the behavioral model thereon, and wherein the control means adaptively controls the storage means based on the values stored on the operation setting storage.

11. The method of claim 6, wherein the storage means is a random access memory (RAM).

12. The method of claim 6, wherein the storage means is a first-in, first-out (FIFO) memory.

13. The method of claim 1, wherein the integrated circuit comprises different functional blocks, and the different functional blocks are described by the RTL model and the behavioral model respectively.

* * * * *